US012624444B2

(12) United States Patent
Matsuki et al.

(10) Patent No.: US 12,624,444 B2
(45) Date of Patent: May 12, 2026

(54) FILM FORMING METHOD AND FILM FORMING APPARATUS

(71) Applicant: Tokyo Electron Limited, Tokyo (JP)

(72) Inventors: Nobuo Matsuki, Nirasaki (JP);
Yoshinori Morisada, Nirasaki (JP);
Takayuki Komiya, Nirasaki (JP);
Satoru Kawakami, Nirasaki (JP); **Taro
Ikeda, Nirasaki (JP); Toshihiko Iwao**,
Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 131 days.

(21) Appl. No.: 18/042,833

(22) PCT Filed: Aug. 12, 2021

(86) PCT No.: PCT/JP2021/029695
§ 371 (c)(1),
(2) Date: Feb. 24, 2023

(87) PCT Pub. No.: WO2022/044817
PCT Pub. Date: Mar. 3, 2022

(65) Prior Publication Data
US 2023/0295797 A1    Sep. 21, 2023

(30) Foreign Application Priority Data
Aug. 26, 2020    (JP) ................................. 2020-142859

(51) Int. Cl.
*C23C 16/34*    (2006.01)
*C23C 16/455*    (2006.01)
*C23C 16/509*    (2006.01)
*C23C 16/52*    (2006.01)

(52) U.S. Cl.
CPC ...... *C23C 16/345* (2013.01); *C23C 16/45529* (2013.01); *C23C 16/4554* (2013.01); *C23C 16/509* (2013.01); *C23C 16/52* (2013.01)

(58) Field of Classification Search
CPC .................................................... C23C 16/345
See application file for complete search history.

(56) References Cited

U.S. PATENT DOCUMENTS

| | | | |
|---|---|---|---|
| 2005/0227500 A1* | 10/2005 | Sugawara | H01L 21/02172 438/785 |
| 2011/0256734 A1* | 10/2011 | Hausmann | H01L 21/0228 257/E21.293 |
| 2015/0099375 A1* | 4/2015 | Haripin | H01L 21/0217 438/793 |
| 2018/0144929 A1* | 5/2018 | Liu | H01L 21/31138 |

(Continued)

FOREIGN PATENT DOCUMENTS

| | | |
|---|---|---|
| JP | 2017-135271 A | 8/2017 |
| JP | 2017-162974 A | 9/2017 |

(Continued)

*Primary Examiner* — Austin Murata
(74) *Attorney, Agent, or Firm* — Armstrong Teasdale LLP

(57) ABSTRACT

A film forming method forms a film on a substrate by plasma in a processing container including a stage configured to hold the substrate thereon, wherein the film forming method includes: (a) a step of supplying a raw material gas and a reaction gas as a processing gas to the processing container; and (b) a step of generating plasma of the processing gas using a radio-frequency power of 100 MHz or higher.

13 Claims, 9 Drawing Sheets

| Content | Experimental example 2 | Experimental example 3 | Experimental example 4 | Comparative example 3 |
|---|---|---|---|---|
| Process temperature | 200°C | 200°C | 200°C | 200°C |
| Silicon-containing gas | Trisilylamine | SiH4 | Tetramethylsilane | SiH4 |
| Nitrogen-containing gas | N2/Ar | N2/Ar | N2/Ar | NH3/Ar |
| Plasma processing | VHF 220MHz | VHF 220MHz | VHF 220MHz | RF 13.56MHz |
| Formed film | SiN | SiN | SiCN | SiN |
| SOC shrinkage | 90nm⇒86nm 4.4% | 90nm⇒84nm 6.6% | 90nm⇒83nm 7.7% | 90nm⇒50nm 44% |

(56)            References Cited

U.S. PATENT DOCUMENTS

2019/0115206 A1 *   4/2019   Kim .................. H01L 21/31111
2019/0237330 A1 *   8/2019   Abatchev ................ H01J 37/32

FOREIGN PATENT DOCUMENTS

JP          2018-050038  A      3/2018
JP          2018-125170  A      8/2018
WO           03088342  A1    10/2003

* cited by examiner

FIG. 3

| Parameter | S21 Supply of 1st raw material | S22 Purge | S23 Supply of 2nd raw material | S24 Purge | S25 Plasma irradiation | S26 Purge |
|---|---|---|---|---|---|---|
| 1st silicon-containing gas (halogen-based raw material) | ▓ | | | | | |
| 2nd silicon-containing gas (non-halogen-based raw material) | | | ▨ | | | |
| Nitrogen-containing gas | ░ | ░ | ░ | ░ | ░ | ░ |
| Inert gas | ░ | ░ | ░ | ░ | ░ | ░ |
| Plasma | | | | | ▨ | |

FIG. 4

| Parameter | Supply of 1st raw material (S31) | Purge (S32) | Plasma irradiation (S34) | Purge (S35) | Supply of 2nd raw material (S36) | Purge (S37) | Plasma irradiation (S38) | Purge (S39) |
|---|---|---|---|---|---|---|---|---|
| 1st silicon-containing gas (halogen-based raw material) | ■ | | | | | | | |
| 2nd silicon-containing gas (non-halogen-based raw material) | | | | | ▨ | | | |
| Nitrogen-containing gas | ░ | ░ | ░ | ░ | ░ | ░ | ░ | ░ |
| Inert gas | ░ | ░ | ░ | ░ | ░ | ░ | ░ | ░ |
| Plasma | | | ▧ | | | | ▨ | |

FIG. 6

| No | 1st raw material (1st precursor) | 2nd raw material (2nd precursor) |
|----|----------------------------------|----------------------------------|
| 1 | DCS | TSA or Si-NH$_2$-based |
| 2 | Cl-based DIPAS | TSA or Si-NH$_2$-based |
| 3 | Cl-based TSA | TSA or Si-NH$_2$-based |

| Content | Experimental example 1 | Comparative example 1 | Comparative example 2 |
|---|---|---|---|
| Process temperature | 200°C | 200°C | 200°C |
| Precursor | Dichlorosilane + Trisilylamine | Trisilylamine | Dichlorosilane |
| Nitrogen-containing gas | N2 | N2 | NH3 |
| Plasma processing | VHF 220MHz | RF 13.56MHz | RF 13.56MHz |
| Pattern upper sidewall coverage | 90% | 20% | 40% |
| SOC shrinkage | 1.1% | 40% | 44% |

FIG. 9

| Parameter | Supply of raw material (S51) | Purge (S52) | Plasma irradiation (S53) | Purge (S54) |
|---|---|---|---|---|
| Silicon-containing gas (halosilane) | ■ | | | |
| Nitrogen-containing gas | ░ | ░ | ░ | ░ |
| Inert gas | ░ | ░ | ░ | ░ |
| Plasma | | | ▨ | |

FIG. 10

Start

↓

S101
Placing wafer

↓

S102
Supplying mixed gas

↓

S103
Forming film

↓

S104
Carrying out wafer

↓

End

| Content | Experimental example 2 | Experimental example 3 | Experimental example 4 | Comparative example 3 |
|---|---|---|---|---|
| Process temperature | 200°C | 200°C | 200°C | 200°C |
| Silicon-containing gas | Trisilylamine | SiH4 | Tetramethylsilane | SiH4 |
| Nitrogen-containing gas | N2/Ar | N2/Ar | N2/Ar | NH3/Ar |
| Plasma processing | VHF 220MHz | VHF 220MHz | VHF 220MHz | RF 13.56MHz |
| Formed film | SiN | SiN | SiCN | SiN |
| SOC shrinkage | 90nm⇒86nm 4.4% | 90nm⇒84nm 6.6% | 90nm⇒83nm 7.7% | 90nm⇒50nm 44% |

FIG. 13

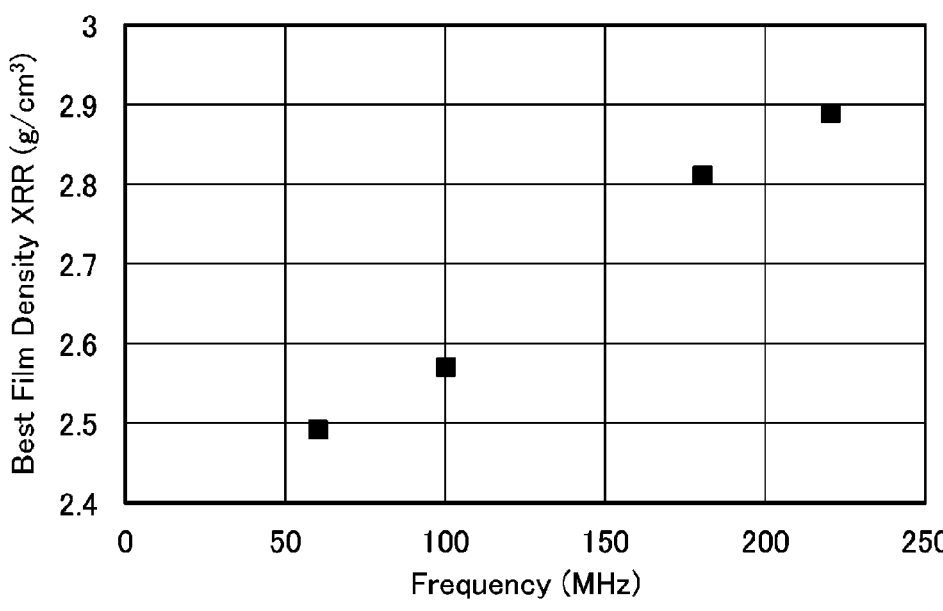

FILM FORMING METHOD AND FILM FORMING APPARATUS

CROSS-REFERENCE TO RELATED APPLICATIONS

The present application is a U.S. National Stage Entry of International Patent Application No. PCT/JP2021/029695, filed Aug. 12, 2021, which claims the benefit of priority to Japanese Patent Application No. 2020-142859, filed Aug. 26, 2020, each of which is hereby incorporated herein by reference in its entirety.

TECHNICAL FIELD

The present disclosure relates to a film forming method and a film forming apparatus.

BACKGROUND

In a semiconductor device manufacturing process, there is atomic layer deposition (ALD) in which a plurality of processing gases are switched to repeatedly stack thin unit films, which are approximately monomolecular layers, on a substrate. There is also plasma-enhanced atomic layer deposition (PEALD) using plasma during film formation. In addition, it has been proposed to form a silicon nitride layer on a wafer by PEALD using the plasma of a silicon-containing precursor and a nitrogen-containing reactant.

PRIOR ART DOCUMENTS

Patent Documents

Patent Document 1: Japanese Laid-Open Publication No. 2018-050038

The present disclosure provides a film forming method and a film forming apparatus capable of suppressing damage caused by plasma.

SUMMARY

An embodiment of the present disclosure discloses a film forming method that forms a film on a substrate by plasma in a processing container including a stage configured to hold the substrate thereon, wherein the film forming method includes: (a) a step of supplying a raw material gas and a reaction gas as a processing gas to the processing container; and (b) a step of generating plasma of the processing gas using a radio-frequency power of 100 MHz or higher.

According to the present disclosure, it is possible to suppress damage caused by plasma.

BRIEF DESCRIPTION OF DRAWINGS

FIG. 3 is a diagram illustrating an example of a film forming process sequence in the first embodiment.

FIG. 4 is a diagram illustrating another example of a film forming process sequence in the first embodiment.

FIG. 6 is a diagram illustrating an example of precursors in a two-precursor process.

FIG. 7 is a view illustrating an example of a wafer as a film formation target in the first embodiment.

FIG. 8 is a diagram illustrating an example of experimental results in the first embodiment.

FIG. 9 is a diagram illustrating another example of the film forming process sequence in a modification.

FIG. 10 is a flowchart illustrating an example of a film forming process in a second embodiment.

FIG. 11 is a view illustrating an example of a wafer as a film formation target in the second embodiment.

FIG. 12 is a diagram illustrating an example of experimental results in the second embodiment.

FIG. 13 is a diagram illustrating an example of experimental results in the second embodiment.

DETAILED DESCRIPTION

Hereinafter, embodiments of a film forming method and a film forming apparatus disclosed herein will be described in detail with reference to the drawings. The technology disclosed herein is not limited by the following embodiments.

When a silicon nitride film is formed by PEALD, 400 kHz, 13.56 MHz, 27.12 MHz, and 60 MHz are usually used as the frequencies of radio-frequency power, and $NH_3$ or amine is used as a nitriding gas. When $NH_3$ or amine is used, H radicals are generated in plasma. H radicals damage metal films or resins. When a substrate having a film formed thereon contains these materials, the film quality of an underlying layer may be adversely affected. Therefore, it is expected to suppress damage caused by plasma and to reduce the influence of H radicals on film quality.

First Embodiment

[Overall Configuration of Film Forming Apparatus 100]

Figure 1:
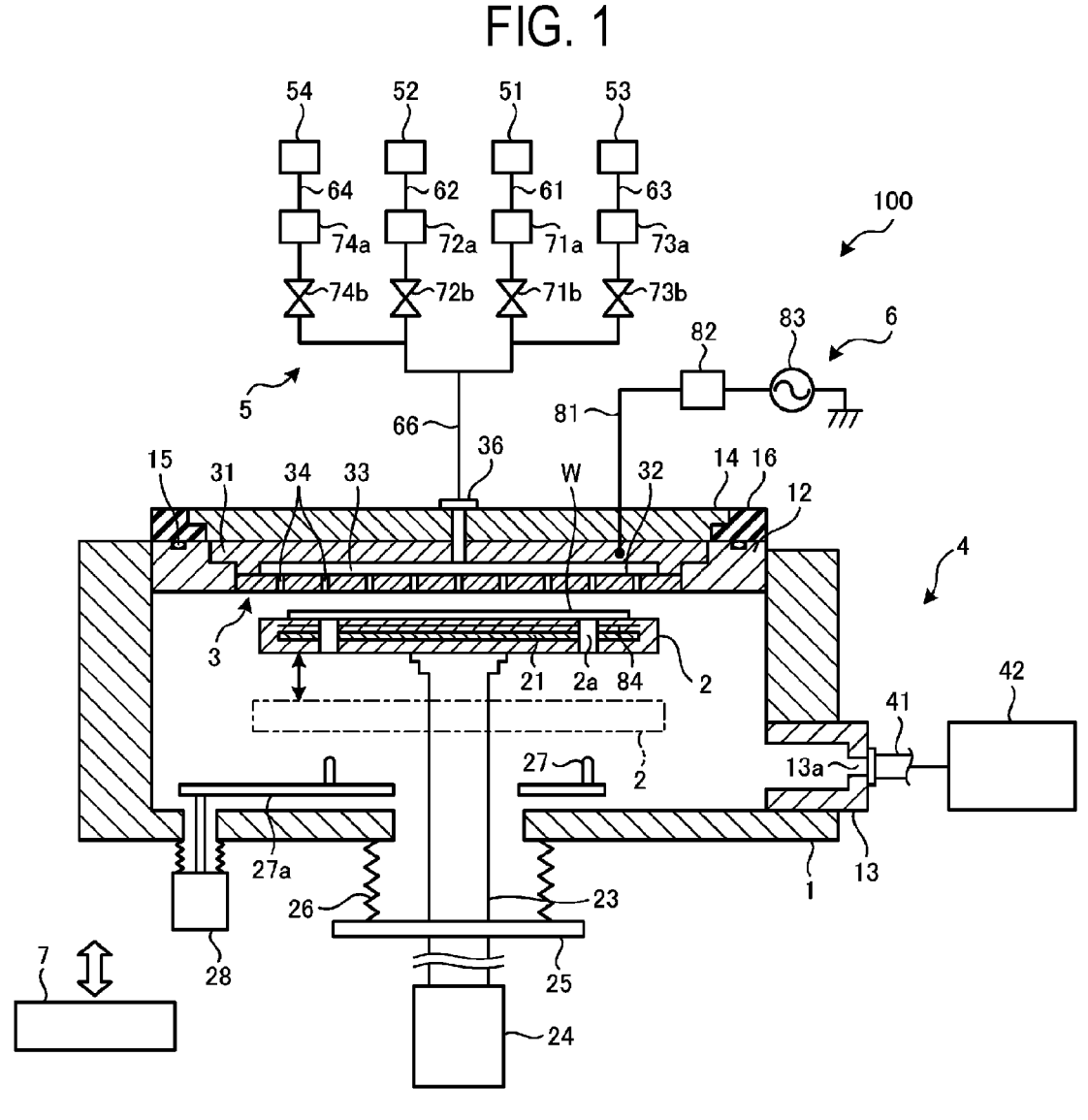
FIG. 1 is a view illustrating an exemplary film-forming apparatus according to a first embodiment of the present disclosure.

FIG. 1 is a view illustrating an example of a film forming apparatus according to a first embodiment of the present disclosure. The film forming apparatus 100 illustrated in FIG. 1 is a capacitively coupled plasma processing apparatus. The film forming apparatus 100 includes a chamber 1, a susceptor 2 that horizontally supports a wafer W as an example of a target substrate in the chamber 1, and a shower head 3 configured to supply a processing gas into the chamber 1 in the form of a shower. In addition, the film forming apparatus 100 includes an exhauster 4 configured to evacuate the interior of the chamber 1, a processing gas supply mechanism 5 configured to supply a processing gas to the shower head 3, a plasma generating mechanism 6, and a controller 7.

The chamber 1 is made of a metal such as aluminum, and has a substantially cylindrical shape. A carry-in/out port for carry-in/out of a wafer W (not illustrated) is formed in the sidewall of the chamber 1, and the carry-in/out port is configured to be opened/closed by a gate valve (not illustrated). A dielectric ring 12 is provided on the upper inner wall of the sidewall of the chamber 1. The dielectric ring 12 is made of ceramic such as alumina ($Al_2O_3$) and is a member that insulates the chamber 1 and the shower head 3 from each other. An exhaust duct 13 is provided in the lower portion of the main body of the chamber 1. An exhaust port 13a is formed in the exhaust duct 13. On the top surface of the dielectric ring 12, a ceiling wall 14 is provided to close an upper opening of the chamber 1. An insulating ring 16 is fitted around the outer periphery of the ceiling wall 14, and the space between the insulating ring 16 and the dielectric ring 12 is hermetically sealed by a seal ring 15.

The susceptor 2 has a disc shape with a diameter larger than that of the wafer W, and is supported by a support member 23. The susceptor 2 is made of a ceramic material such as aluminum nitride (AlN) or a metal material such as aluminum or a nickel-based alloy, and has a heater 21 embedded therein so as to heat the wafer W. The heater 21 is fed with power from a heater power supply (not illustrated) to generate heat. By controlling the output of the heater 21 by a temperature signal of a thermocouple (not illustrated) provided in the vicinity of a wafer placement surface of the top surface of the susceptor 2, the wafer W is controlled to have a predetermined temperature. A cooling medium flow path may be provided inside the susceptor 2, and the wafer W may be cooled to a predetermined temperature by a cooling medium supply mechanism via the wafer placement surface.

The support member 23 configured to support the susceptor 2 extends to the lower side of the chamber 1 through a hole formed in the bottom wall of the chamber 1 from the center of the bottom surface of the susceptor 2, and the lower end of the support member 23 is connected to a lifting mechanism 24. The susceptor 2 is configured to be raised and lowered between a processing position illustrated in FIG. 1 and a transport position below the processing position at which the wafer is capable of being transported (indicated by the alternating long and short dash line in FIG. 1) by the lifting mechanism 24 via the support member 23. A flange member 25 is installed on the support member 23 at a position below the chamber 1. A bellows 26 is provided between the bottom surface of the chamber 1 and the flange member 25 to separate the atmosphere in the chamber 1 from the outside air and expand and contract as the susceptor 2 is raised and lowered.

Three wafer support pins 27 (of which only two are illustrated) are provided in the vicinity of the bottom surface of the chamber 1 to protrude upward from a lifting plate 27a. The wafer support pins 27 are configured to be raised and lowered by a lifting mechanism 28 provided below the chamber 1, via the lifting plate 27a. The wafer support pins 27 are inserted into through holes 2a provided in the susceptor 2 located at the transport position so as to protrude and retract with respect to the top surface of the susceptor 2. By raising and lowering the wafer support pins 27 in this manner, the wafer W is delivered between the wafer transport mechanism (not illustrated) and the susceptor 2.

The shower head 3 is made of a metal and provided to face the susceptor 2. The shower head 3 includes a main body 31 fixed to the ceiling wall 14 of the chamber 1 and having a gas diffusion space therein.

A gas introduction hole 36 leading to the gas diffusion space 33 is formed in the center of the upper wall of the main body 31. In addition, the gas introduction hole 36 is also continuously formed in the ceiling wall 14. A pipe (described later) of the processing gas supply mechanism 5 is connected to the gas introduction hole 36. A shower plate 32 having gas ejection holes 34 is provided on the bottom surface of the main body 31. The processing gas introduced into the gas diffusion space 33 is ejected toward the wafer W from the gas ejection holes 34.

The exhauster 4 includes an exhaust pipe 41 connected to the exhaust port 13a in the exhaust duct 13 and an exhaust mechanism 42 connected to the exhaust pipe 41 and including a vacuum pump, a pressure control valve, or the like. During processing, the gas within the chamber 1 is exhausted from the exhaust duct 13 through the exhaust pipe 41 by the exhaust mechanism 42 of the exhauster 4.

The processing gas supply mechanism 5 supplies a processing gas when performing ALD film formation. The processing gas supply mechanism 5 includes a raw material gas source 51 configured to supply a raw material gas (film forming gas) containing a constituent element of a film to be formed, a reaction gas source 52 configured to supply a reaction gas that reacts with the raw material gas, and first and second purge gas sources 53 and 54 configured to supply a purge gas. In addition, the processing gas supply mechanism 5 includes a raw material gas supply pipe 61 extending from the raw material gas source 51 and a reaction gas supply pipe 62 extending from the reaction gas source 52. In addition, the processing gas supply mechanism 5 includes a first purge gas supply pipe 63 extending from the first purge gas source 53 and a second purge gas supply pipe 64 extending from the second purge gas source 54.

The raw material gas supply pipe 61 and the reaction gas supply pipe 62 merge into a pipe 66. The pipe 66 is connected to the gas introduction hole 36 described above. The first purge gas supply pipe 63 is connected to the raw material gas supply pipe 61, and the second purge gas supply pipe 64 is connected to the reaction gas supply pipe 62. The raw material gas supply pipe 61 is provided with a mass flow controller 71a as a flow rate controller and an opening/closing valve 71b. The reaction gas supply pipe 62 is provided with a mass flow controller 72a and an opening/closing valve 72b. The first purge gas supply pipe 63 is provided with a mass flow controller 73a and an opening/closing valve 73b. The second purge gas supply pipe 64 is provided with a mass flow controller 74a and an opening/closing valve 74b. In addition, the processing gas supply mechanism 5 is configured to be capable of performing a desired ALD process or chemical vapor deposition (CVD) process as described later by switching the opening/closing valves 71b and 72b.

In the processing gas supply mechanism 5, the purge gas supplied from the first purge gas supply pipe 63 and the second purge gas supply pipe 64 serves as a carrier gas when supplying a raw material gas and when supplying a reaction gas. By providing pipes that respectively branch from the first purge gas supply pipe 63 and the second purge gas supply pipe 64 and increase the flow rate of the purge gas only at the time of purging, the processing gas supply mechanism 5 may increase the flow rate of the purge gas during the purge process. As the purge gas, an inert gas, for example, a rare gas such as Ar gas or He gas, or $N_2$ gas, may be used.

As the raw material gas and the reaction gas, various gases may be used depending on a film to be formed. A predetermined film may be formed by adsorbing the raw material gas on the surface of the wafer and causing the reaction gas to react with the adsorbed raw material gas. In the first embodiment, a silicon-containing gas is used as the raw material gas, and a nitrogen-containing gas is used as the reaction gas.

The plasma generating mechanism 6 is for turning the reaction gas into plasma when supplying the reaction gas and causing the reaction gas to react with the adsorbed raw material gas. The plasma generating mechanism 6 includes a power feed line 81 connected to the main body 31 of the shower head 3, a matcher 82 and a radio-frequency power supply 83 connected to the power feed line 81, and an electrode 84 embedded in the susceptor 2. The electrode 84 is grounded. When radio-frequency power is supplied from the radio-frequency power supply 83 to the shower head 3, a radio-frequency electric field is formed between the shower head 3 and the electrode 84, and the plasma of the reaction gas is generated by the radio-frequency electric field. The matcher 82 matches the load impedance including the plasma with the internal (or output) impedance of the radio-frequency power supply 83. The matcher 82 functions such that the output impedance of the radio-frequency power supply 83 apparently coincides with the load impedance when the plasma is generated in the chamber 1. The radio-frequency power supply 83 supplies radio-frequency power with a frequency of 100 MHz or higher and 1 GHz or lower to the shower head 3. The frequency of the radio-frequency power may be, for example, frequencies such as 180 MHz, 220 MHz, 500 MHz, and 860 MHz, or an arbitrary frequency between 100 MHz and each frequency. The radio-frequency power includes ultra-high frequency (UHF), but will be collectively referred to as a very high frequency (VHF) in the following description.

The reason for using radio-frequency power with a frequency of 100 MHz or higher and 1 GHz or lower is as follows. An energy of 10 eV is required for dissociating nitrogen ($N_2$) gas, and a high-density plasma of about 10 eV or higher is required for dissociating into plasma. However, in a radio-frequency (RF) plasma source using a shower plate, such as capacitively coupled plasma (CCP), it is difficult to generate high-density plasma that dissociates $N_2$. In this regard, it has been found that by using VHF (UHF) of 100 MHz to 1 GHz, even with a shower plate-type plasma processing apparatus, high-density plasma is generated in a pressure range of 10 mTorr to 10 Torr, so it is possible to generate N radicals with high nitriding power. In such a plasma processing apparatus, by introducing $O_2$ that dissociates at about 5 eV, it is possible to generate oxygen radicals with high oxidizing power.

The controller 7 includes a main controller, an input device, an output device, a display device, and a storage device. The main controller controls respective components of the film forming apparatus 100, for example, the opening/closing valves 71b to 74b, the mass flow controllers 71a to 74a, the radio-frequency power supply 83, the heater 21, the vacuum pump of the exhaust mechanism 42, and the like. The main controller performs control by using, for example, a computer (a central processing unit (CPU)). The storage device stores parameters of various processes performed by the film forming apparatus 100. In addition, a program for controlling processes executed by the film forming apparatus 100, that is, a storage medium storing processing recipes is set in the storage device. The main controller calls a predetermined processing recipe stored in the storage medium, and controls the film forming apparatus 100 to execute a predetermined process, based on the processing recipe. For example, the controller 7 controls the opening/closing times of the opening/closing valves 71b and 72b so as to control the time for one-time supply of the raw material gas.

In the film forming apparatus 100 configured as described above, first, the gate valve (not illustrated) is opened, and a wafer W is carried into the chamber 1 through the carry-in/out port (not illustrated) and placed on the susceptor 2 by a transport apparatus (not illustrated). The transport apparatus is retracted, and the controller 7 raises the susceptor 2 to the processing position. Then, the controller 7 closes the gate valve to maintain the interior of the chamber 1 at a predetermined reduced pressure, and controls the temperature of the susceptor 2 to a predetermined temperature by the heater 21 depending on a film forming reaction when performing ALD film formation. The controller 7 may set the predetermined temperature to a temperature, for example, in the range of −50 degrees C. to 700 degrees C. The predetermined temperature is preferably 500 degrees C. or lower, 400 degrees C. or lower, or 350 degrees C. or lower, and more preferably 300 degrees C. or lower. In addition, the predetermined temperature is more preferably 200 degrees C. or lower.

In this state, the controller 7 opens the opening/closing valves 73b and 74b and continuously supplies the purge gas from the first purge gas source 53 and the second purge gas source 54 through the first purge gas supply pipe 63 and the second purge gas supply pipe 64. The controller 7 intermittently and alternately opens and closes the opening/closing valve 71b of the raw material gas supply pipe 61 and the opening/closing valve 72b of the reaction gas supply pipe 62 while continuously supplying the purge gas. In addition, the controller 7 turns on the radio-frequency power supply 83 of the plasma generating mechanism 6 at the supply timing of the reaction gas.

The controller 7 sequentially repeats a raw material gas supply step (raw material gas+purge gas), a purge step (only purge gas), a reaction gas supply step (reaction gas+purge gas+plasma), and a purge step (only purge gas). As a result, predetermined film formation by PEALD is performed. In the first embodiment, since the reaction gas is reactive with plasma, during the film formation period, the reaction gas is constantly supplied, and only the plasma is turned on/off.

Film Forming Method of First Embodiment

Figure 2:
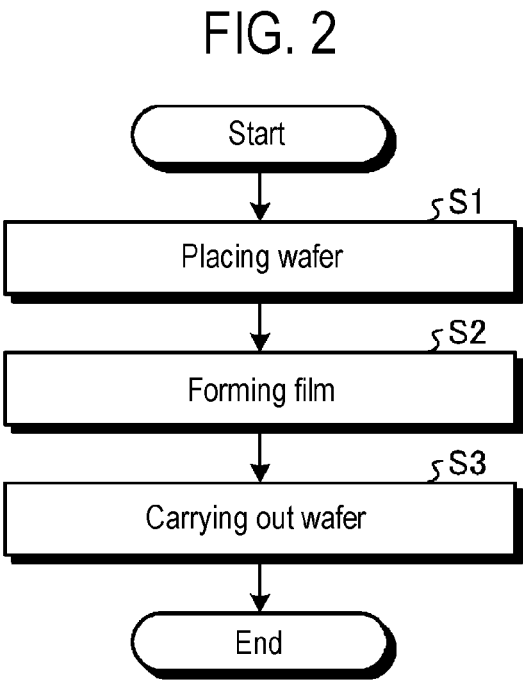
FIG. 2 is a flowchart illustrating an example of a film forming process in the first embodiment.

Next, a film forming method by a two-precursor process in the first embodiment will be described. FIG. 2 is a flow chart illustrating an example of film formation processing in the first embodiment.

In the film forming method by the two-precursor process in the first embodiment, the controller 7 causes the transport apparatus to carry a wafer W into the chamber 1 and place the wafer W on the susceptor 2. On the wafer W, for example, a spin-on-carbon (SOC) film is formed as an underlying film (first film). The controller 7 retracts the transport apparatus and raises the susceptor 2 to the processing position. The controller 7 closes the gate valve to maintain the interior of the chamber 1 in a predetermined pressure-reduced state, and starts temperature control of the susceptor 2 by the heater 21 so that the wafer W reaches a predetermined temperature (step S1).

Next, the controller 7 executes a film forming step (step S2). Here, a process for forming a silicon nitride film (SiN film) by using two precursors will be described with reference to FIG. 3. FIG. 3 is a diagram illustrating an example of a film forming process sequence in the first embodiment. In the sequence illustrated in FIG. 3, description will be made by using, as parameters, a first silicon-containing gas and a second silicon-containing gas as raw material gases, a nitrogen-containing gas as a reaction gas, an inert gas as a purge gas, and plasma. In addition, in the figure illustrating the following sequence including FIG. 3, hatched squares represent gas supply or plasma irradiation.

The first silicon-containing gas is a gas containing a halogen-based raw material, for example, a gas containing dichlorosilane (DCS), Cl-based diisopropylaminosilane (DIPAS), Cl-based trisilylamine (TSA), or the like. That is, the first silicon-containing gas is a gas containing a halogen-containing silane. The second silicon-containing gas is a gas containing a non-halogen raw material, such as trisilylamine (TSA), a Si—$NH_2$-based gas, or the like. That is, the second silicon-containing gas is a gas containing a halogen-free silane. The nitrogen-containing gas is $N_2$ gas, and the inert gas is, for example, helium (He) gas, argon (Ar) gas, or a mixed gas thereof. Plasma indicates presence/absence of plasma irradiation.

In the sequence illustrated in FIG. 3, the nitrogen-containing gas and the inert gas are continuously supplied in each step. First, as a first raw material supply step, the controller 7 supplies a first silicon-containing gas to the chamber 1 (step S21). Next, as a purge step, the controller 7 stops the supply of the first silicon-containing gas and performs purge with the nitrogen-containing gas and the inert gas (step S22).

As a second raw material supply step, the controller 7 supplies the second silicon-containing gas to the chamber 1 (step S23). Next, as a purge step, the controller 7 stops the supply of the second silicon-containing gas and performs purge with the nitrogen-containing gas and the inert gas (step S24).

As a plasma irradiation step, the controller 7 turns on the radio-frequency power supply 83 to supply radio-frequency power and performs plasma irradiation in the state in which the nitrogen-containing gas and the inert gas are supplied (step S25). Since the radio-frequency power has a frequency of 100 MHz or higher, it is possible to perform nitriding with $N_2$ plasma. After a predetermined period of time has elapsed, the controller 7 turns off the radio-frequency power supply 83 to stop the supply of radio-frequency power. As a purge step, the controller 7 performs purge with the nitrogen-containing gas and the inert gas after stopping the supply of radio-frequency power (step S26). The controller 7 repeats the sequence of steps S21 to S26 a predetermined number of times to complete the film forming step.

Returning to a description made with reference to FIG. 2, when the film forming step is completed, the controller 7 opens the gate valve, carries out the wafer W from the chamber 1 by the transport apparatus (step S3), and terminates the film formation processing. As described above, since a silicon nitride film is formed by supplying radio-frequency power of 100 MHz or higher to cause the plasma of a nitrogen-containing gas, which does not contain ammonia or amine, to react with a silicon-containing gas, it is possible to suppress damage caused by plasma and to reduce the influence of H radicals on film quality. In addition, since high-energy N radicals are generated by radio-frequency power of 100 MHz or higher, it is possible to perform ALD film formation of a silicon nitride film at a low temperature. That is, since it is possible to suppress damage to fragile underlying layers such as fine elements and a resist, it is possible to form a silicon nitride film on these underlying layers by ALD. In addition, since $NH_3$ and amine are not used during plasma processing, it is possible to greatly reduce damage caused by NH.

Next, another example of the film forming process using two precursors will be described with reference to FIG. 4. FIG. 4 is a diagram illustrating another example of a film forming process sequence in the first embodiment. The sequence illustrated in FIG. 4 differs from the sequence illustrated in FIG. 3 in that a plasma irradiation step is added between the first raw material supply step and the second raw material supply step. In the sequence illustrated in FIG. 4, as in the sequence illustrated in FIG. 3, description will be made by using, as parameters, a first silicon-containing gas and a second silicon-containing gas as raw material gases, a nitrogen-containing gas as a reaction gas, an inert gas as a purge gas, and plasma.

In the sequence illustrated in FIG. 4, the nitrogen-containing gas and the inert gas are continuously supplied in each step. First, as a first raw material supply step, the controller 7 supplies a first silicon-containing gas to the chamber 1 (step S31). Next, as a purge step, the controller 7 stops the supply of the first silicon-containing gas and performs purge with the nitrogen-containing gas and the inert gas (step S32).

As the first plasma irradiation step, the controller 7 turns on the radio-frequency power supply 83 to supply radio-frequency power and performs plasma irradiation in the state in which the nitrogen-containing gas and the inert gas are supplied (step S34). After a predetermined period of time has elapsed, the controller 7 turns off the radio-frequency power supply 83 to stop the supply of radio-frequency power. As a purge step, the controller 7 performs purge with the nitrogen-containing gas and the inert gas after stopping the supply of radio-frequency power (step S35).

As a second raw material supply step, the controller 7 supplies the second silicon-containing gas to the chamber 1 (step S36). Next, as a purge step, the controller 7 stops the supply of the second silicon-containing gas and performs purge with the nitrogen-containing gas and the inert gas (step S37).

As the second plasma irradiation step, the controller 7 turns on the radio-frequency power supply 83 to supply radio-frequency power and performs plasma irradiation in the state in which the nitrogen-containing gas and the inert gas are supplied (step S38). Since the radio-frequency power has a frequency of 100 MHz or higher, it is possible to perform nitriding with N radicals from $N_2$ plasma. After a predetermined period of time has elapsed, the controller 7 turns off the radio-frequency power supply 83 to stop the supply of radio-frequency power. As a purge step, the controller 7 performs purge with the nitrogen-containing gas and the inert gas after stopping the supply of radio-frequency power (step S39). The controller 7 repeats a series of sequence of steps S31 to S39 a predetermined number of times. In the sequence illustrated in FIG. 4, since the plasma irradiation is performed after the first silicon-containing gas is supplied, it is possible to activate the first silicon-containing gas adsorbed on the wafer W and to improve the efficiency of chemisorption.

[Film Forming Model]

Figure 5:
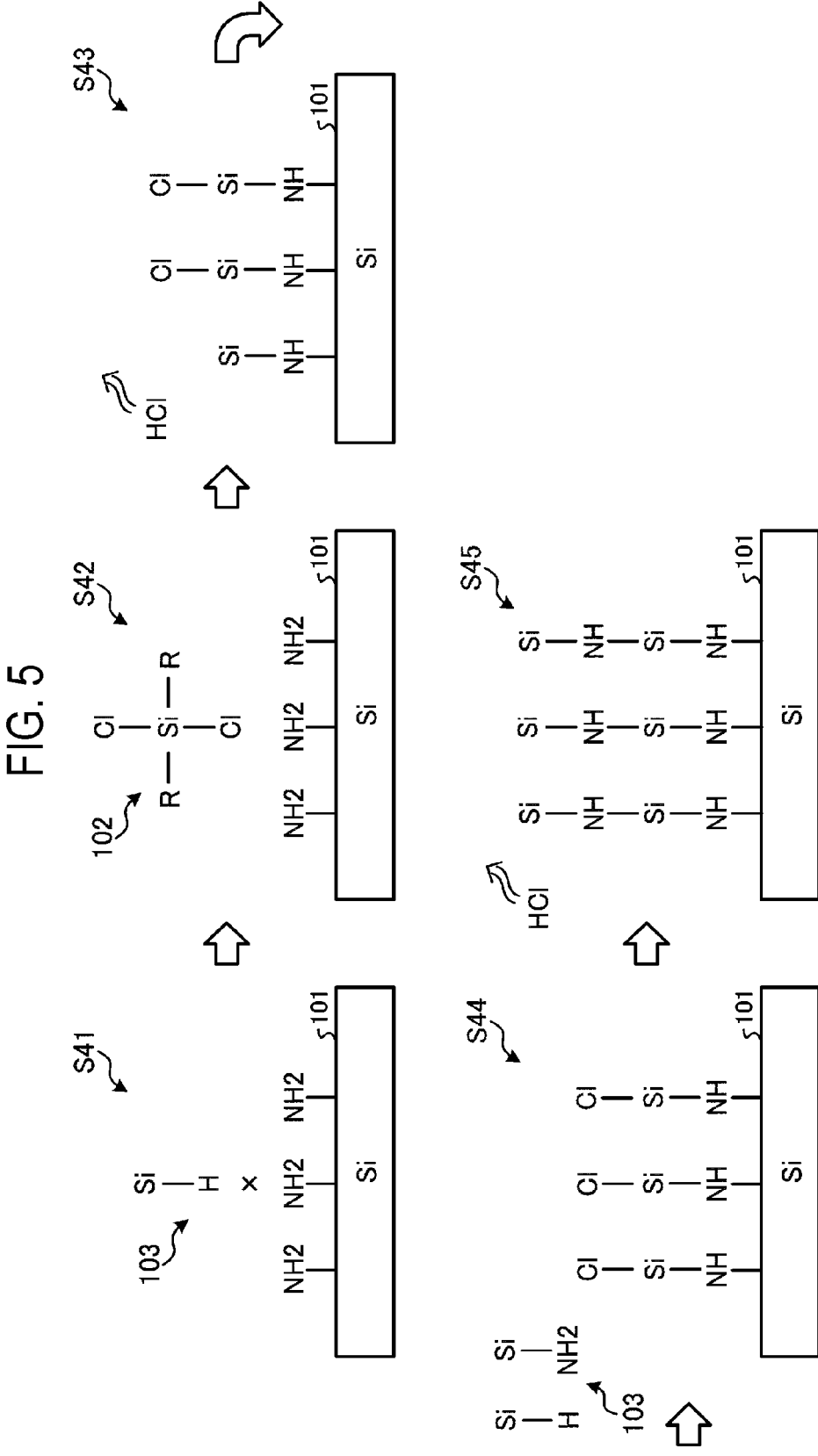
FIG. 5 is a diagram illustrating an example of a film forming model of a silicon nitride film at a low temperature by PEALD.

Next, a film forming model of a silicon nitride film at a low temperature by PEALD in the first embodiment will be described with reference to FIGS. 5 and 6. FIG. 5 is a diagram illustrating an example of a film forming model of a silicon nitride film at a low temperature by PEALD. As illustrated in step S41 of FIG. 5, when $NH_2$ is present on a silicon (Si) wafer 101, a non-halogen precursor 103 is not adsorbed. Next, as illustrated in step S42, when a halogen-based precursor 102 is introduced, as illustrated in step S43, $NH_2$ on the wafer 101 is replaced with Cl in the precursor 102 to become HCl, which is released, and Si in the precursor 102 is adsorbed with NH. At this time, the Cl on the other side of the precursor 102 is adsorbed together with Si.

Subsequently, as illustrated in step S44, when a non-halogen precursor 103 is introduced, $NH_2$ of the precursor 103 reacts with the already adsorbed Cl. Then, as illustrated in step S45, the Cl and H in $NH_2$, which have reacted with each other, become HCl, which is released, and NH in the precursor 103 is adsorbed to Si, which has been adsorbed to the wafer 101. Thus, in the two-precursor process, it is possible to improve nitriding efficiency and to reduce the influence of halogen. In other words, in the first layer of ALD film formation, the underlying layer and halogen come into contact with each other. However, in the second and subsequent layers, the underlying layer and halogen do not come into contact with each other. Thus, it is possible to suppress damage to an underlying layer, such as resist or metal due to halogen. In addition, barrier performance may be further improved by depositing a liner film made of a non-halogen material to a thickness of 1 to 5 nm on the underlying layer.

FIG. 6 is a diagram illustrating an example of precursors in a two-precursor process. FIG. 6 illustrates combinations of precursors in the film forming model of FIG. 5. A first raw material (first precursor) in FIG. 6 corresponds to the halogen-based precursor 102 in FIG. 5. A second raw material (second precursor) corresponds to the non-halogen precursor 103 in FIG. 5. That is, DCS, Cl-based DIPAS or Cl-based TSA may be used as the precursor 102. As the precursor 103, TSA or Si—NH₂-based gas may be used. That is, the precursor 102 corresponds to the first silicon-containing gas, and the precursor 103 corresponds to the second silicon-containing gas. By appropriately selecting precursors having different molecular structures, it is possible to adjust the thickness of each adsorption layer. In the case of using a halosilane, which will be described later, it is also possible to adjust the thickness of each adsorption layer by appropriately selecting the precursors.

Experimental Results of First Embodiment

Next, experimental results will be described with reference to FIGS. 7 and 8. In the following description, for convenience, the film formation processing of each experimental example according to the first embodiment may be referred to as VHF-ALD, and the film formation processing in each comparative example using the conventional RF signal frequency (13.56 MHz) as the frequency of radio-frequency power may be sometimes referred to as RF-ALD.

First, the configuration of a wafer W as a film formation target will be described. FIG. 7 is a view illustrating an example of a wafer as a film formation target in the first embodiment. As illustrated in FIG. 7, the wafer W has a pattern of a spin-on-carbon (SOC) film 111 as an underlying film formed on a base substrate 110. In the pattern in this experiment, an SOC film 111 having a height of 90 nm and a space of 40 nm was used. In this experiment, experiments were conducted on the case of forming a silicon nitride film (SiN) on the side surface 112, top surface 113, and bottom surface 114 of the pattern. The SOC film 111 is an example of the first film, and the silicon nitride film is an example of the second film.

FIG. 8 is a diagram illustrating an example of experimental results in the first embodiment. In FIG. 8, in Experimental Example 1 and Comparative Examples 1 and 2, a shower plate-type film forming apparatus was used. The stage interval between the susceptor 2 and the shower plate 32 was set to 60 mm in Experimental Example 1, and was set to 10 mm in Comparative Examples 1 and 2. In Experimental Example 1 and Comparative Examples 1 and 2, wafers W on each of which the pattern illustrated in FIG. 7 was formed were processed.

Processing Conditions of Experimental Example 1

Pressure inside chamber 1: 0.3 Torr (40.0 Pa)
Radio-frequency power (VHF 220 MHz): 1,000 W (CW)
Process temperature (stage temperature): 200 degrees C.
Processing gas:
    First silicon-containing gas: dichlorosilane (DCS): 100 sccm Second silicon-containing gas: trisilylamine (TSA): 100 sccm
    Nitrogen-containing gas: N₂ gas: 4,000 sccm
    Inert gas: He/Ar mixed gas: 1,000 sccm

Processing Conditions of Comparative Examples 1 and 2

Pressure inside chamber 1: 2 Torr (267 Pa)
Radio-frequency power (RF 13.56 MHz): 500 W (CW)
Process temperature (stage temperature): 200 degrees C.
Processing gas:
(Comparative Example 1) Silicon-containing gas: trisilylamine (TSA): 100 sccm
    Nitrogen-containing gas: N₂ gas: 500 sccm
    Inert gas: He/Ar mixed gas: 2,000 sccm
(Comparative Example 2) Silicon-containing gas: dichlorosilane (DCS): 100 sccm
    Nitrogen-containing gas: NH₃ gas: 500 sccm
    Inert gas: He/Ar mixed gas: 2,000 sccm As illustrated in FIG. 8, in Experimental Example 1, a pattern upper sidewall coverage, which indicates a coverage ratio on the side surface 112 of the pattern of the wafer W, was 90%, and a shrinkage rate of the SOC film 111 was 1.1% (90 nm→89 nm). Thus, it was possible to form a silicon nitride film on the side surface 112 while reducing damage to the SOC film 111. In Comparative Examples 1 and 2, the pattern upper sidewall coverages were 20% and 40%, respectively, and the shrinkage rates of the SOC film 111 were 40% (90 nm→54 nm) and 44% (90 nm→50 nm), respectively. Thus, the SOC films 111 were damaged. Furthermore, in Comparative Examples 1 and 2, the formation of the silicon nitride films on the side surfaces 112 was insufficient. Thus, in the first embodiment, it is possible to form a silicon nitride film (SiN film) at a low temperature of 350 degrees C. or lower without using NH₃ and amine, and to perform ALD film formation of a silicon nitride firm on a carbon film (SOC film), which is week in resistance to H radicals and high-temperature resistance. In addition, by optimizing the stage interval between the shower plate 32, which is an electrode to which radio-frequency power is supplied, and the susceptor 2 on which the wafer W is placed, it is possible to implement ion damage reduction and N radical irradiation.

The applicable ranges of processing conditions in the first embodiment are illustrated below.

Applicable Ranges of Processing Conditions of First Embodiment

Pressure inside chamber 1: 0.01 Torr to 50 Torr
Radio-frequency power (VHF 100 MHz to 1 GHz): 10 W to 10 kW
Process temperature (stage temperature): −50 degrees C. to 700 degrees C.
Processing gas:
    First silicon-containing gas: dichlorosilane (DCS): 10 sccm to 5,000 sccm
    Second silicon-containing gas: Trisilylamine (TSA): 10 sccm to 5,000 sccm
    Nitrogen-containing gas: N₂ gas: 100 sccm to 50,000 sccm
    Inert gas: He/Ar mixed gas: 0 sccm to 50,000 sccm

Modification of First Embodiment

In the first embodiment described above, an example of forming a silicon nitride film by a film forming process using two precursors in a film forming step has been described, but the present disclosure is not limited thereto. For example, a film forming process using halosilane may be used, and this case will be described with reference to FIG. 9. FIG. 9 is a diagram illustrating another example of the film forming process sequence in a modification.

In the sequence illustrated in FIG. 9, description will be made by using, as parameters, a silicon-containing gas as a raw material gas, a nitrogen-containing gas as a reaction gas, an inert gas as a purge gas, and plasma. The silicon-containing gas is a gas containing a halogen-based raw material, such as halosilane. The nitrogen-containing gas is $N_2$ gas, and the inert gas is, for example, a mixed gas containing helium (He) gas and argon (Ar) gas. Plasma indicates presence/absence of plasma irradiation.

In the sequence illustrated in FIG. 9, the nitrogen-containing gas and the inert gas are continuously supplied in each step. First, as a raw material supply step, the controller 7 supplies a silicon-containing gas to the chamber 1 (step S51). Next, as a purge step, the controller 7 stops the supply of the silicon-containing gas and performs purge with the nitrogen-containing gas and the inert gas (step S52).

As a plasma irradiation step, the controller 7 turns on the radio-frequency power supply 83 to supply radio-frequency power and performs plasma irradiation in the state in which the nitrogen-containing gas and the inert gas are supplied (step S53). Since the radio-frequency power has a frequency of 100 MHz or higher, it is possible to perform nitriding with $N_2$ plasma. After a predetermined period of time has elapsed, the controller 7 turns off the radio-frequency power supply 83 to stop the supply of radio-frequency power. As a purge step, the controller 7 performs purge with the nitrogen-containing gas and the inert gas after stopping the supply of radio-frequency power (step S54). The controller 7 repeats a series of sequence of steps S51 to S54 a predetermined number of times. In the sequence illustrated in FIG. 9 as well, since the silicon-containing gas has a Si—N skeleton at the step of adsorption of the silicon-containing gas, it is possible to form a silicon nitride film in the same manner as in the two-precursor case. When the number of halogen atoms in the silicon-containing gas is 1, halogen is discharged in the form of HCl even in $N_2$ plasma. Thus, the amount of halogen remaining in the film may be made 0.1 at % or less.

Second Embodiment

In the first embodiment, a silicon nitride film was formed by VHF-ALD, but the silicon nitride film may be formed by plasma enhanced chemical vapor deposition (PECVD) using VHF radio-frequency power. An embodiment in this case will be described as a second embodiment. The film forming apparatus in the second embodiment is similar to the film forming apparatus 100 in the first embodiment. Thus, redundant descriptions of the configurations and operations thereof will be omitted. In the following description, PECVD in the second embodiment may be referred to as VHF-CVD.

Film Forming Method of Second Embodiment

Figures 10, 11:
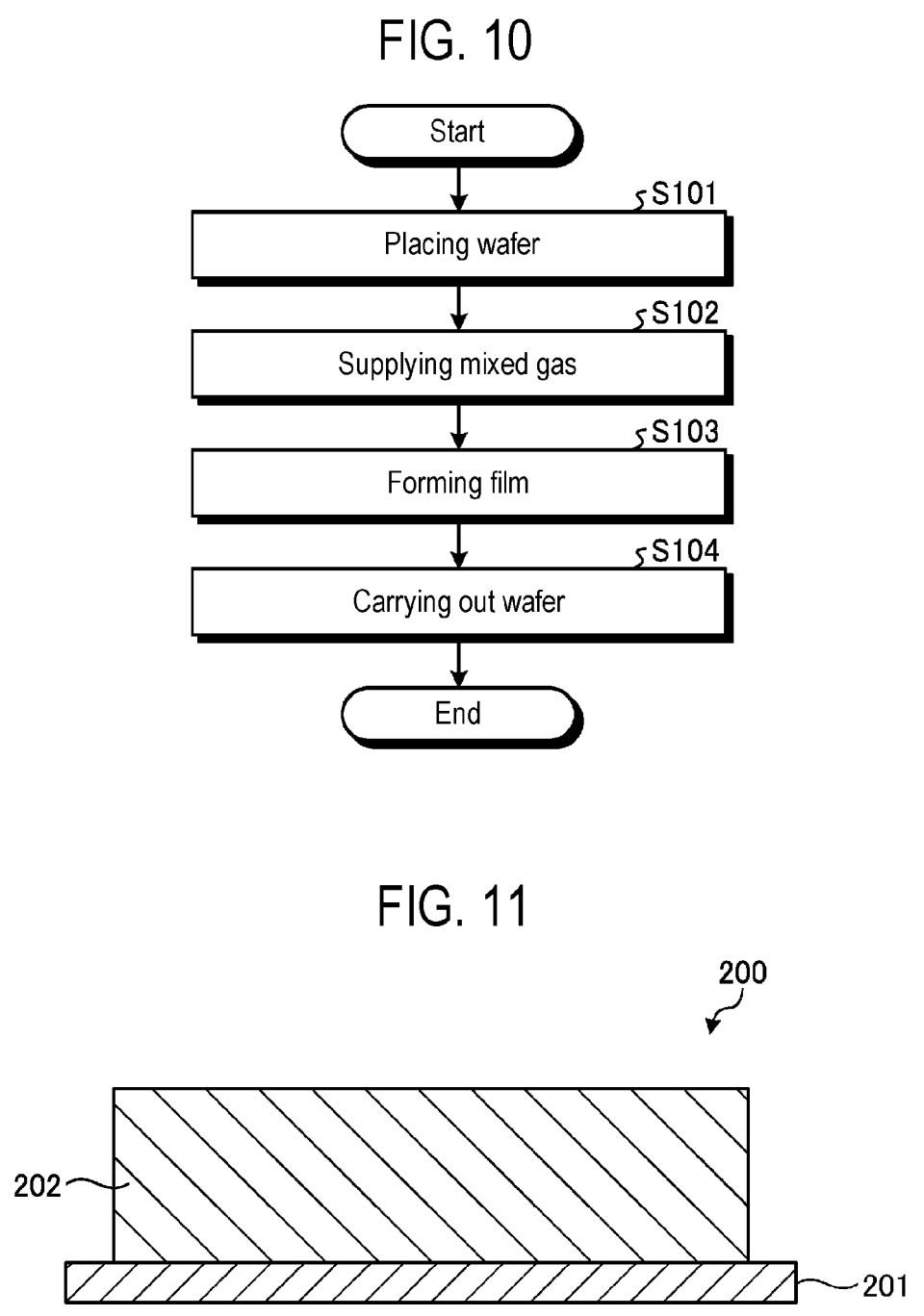

FIG. 10 is a flowchart illustrating an example of film formation processing in the second embodiment. In the film forming method by VHF-CVD illustrated in FIG. 10, the controller 7 causes the transport apparatus to carry a wafer 200, which will be described later, into the chamber 1 and place the wafer 200 on the susceptor 2. An SOC film is formed as an underlying film on the wafer 200. The controller 7 retracts the transport apparatus and raises the susceptor 2 to the processing position. The controller 7 closes the gate valve to maintain the interior of the chamber 1 in a predetermined pressure-reduced state, and starts temperature control of the susceptor 2 by the heater 21 so that the wafer 200 reaches a predetermined temperature (step S101).

The controller 7 controls the processing gas supply mechanism 5 to supply a processing gas having a predetermined composition to the gas introduction hole 36 when the temperature of the wafer 200 is adjusted to a predetermined temperature. The processing gas is diffused in the gas diffusion space 33 and supplied to the processing space through gas ejection holes 35 of the shower plate 32. The processing gas supply mechanism 5 supplies various gases such as a silicon-containing gas, a nitrogen-containing gas, and an inert gas according to VHF-CVD. The controller 7 supplies, as the processing gas, a mixed gas of, for example, a silicon-containing gas as a raw material gas and a nitrogen-containing gas containing an inert gas to the processing space (step S102).

As the silicon-containing gas, for example, a gas containing one or more of trisilylamine (TSA), dichlorosilane (DCS), $SiH_4$, and tetramethylsilane ($Si(CH_3)_4$) may be used. When tetramethylsilane is used, a SiCN film is formed. As the nitrogen-containing gas, a mixed gas of $N_2$ gas and a gas containing helium (He) or argon (Ar) as an inert gas may be used.

The controller 7 executes a film forming step (step S103). In the film forming step, the controller 7 controls the radio-frequency power supply 83 to supply radio-frequency power of 100 MHz or higher to the shower head 3. Plasma is generated in the processing space by supplying the radio-frequency power to the shower head 3. Since the radio-frequency power has a frequency of 100 MHz or higher, it is possible to perform nitriding with $N_2$ plasma. By using a frequency of 180 MHz or higher for the radio-frequency power, it becomes possible to increase the density of a nitride film. A silicon nitride film is formed on the wafer 200 by $N_2$ plasma generated in the processing space. When the film formation is completed, the controller 7 carries out the wafer 200 (step S104) and terminates film formation processing.

That is, after the silicon nitride film is formed on the wafer 200, the controller 7 controls the radio-frequency power supply 83 to stop the supply of radio-frequency power to the processing space. The controller 7 opens the gate valve, carries out the wafer 200 from the chamber 1 by the transport apparatus, and terminates the film formation process. This makes it possible to suppress damage caused by plasma to the underlying film of the wafer 200.

Experimental Results of Second Embodiment

Next, experimental results will be described with reference to FIGS. 11 to 13. In the following description, the film forming processing of the comparative example using the conventional RF signal frequency (13.56 MHz) as the frequency of the radio-frequency power will be referred to as RF-CVD.

First, the configuration of a wafer 200 as a film formation target will be described. FIG. 11 is a view illustrating an example of a wafer as a film formation target in the second embodiment. As illustrated in FIG. 11, in the wafer 200, an SOC film 202 is formed on a base substrate 201 as an underlying film. In this experiment, the SOC film 202 with a film thickness of 90 nm was used. In this experiment, an experiment was conducted in the case of forming a silicon nitride film (SiN) or SiCN film on the SOC film 202.

FIG. 12 is a diagram illustrating an example of experimental results in the second embodiment. In FIG. 12, in Experimental Examples 2 to 4 and Comparative Example 3, a shower plate-type film forming apparatus was used. The stage interval between the susceptor 2 and the shower plate 32 was set to 60 mm in Experimental Examples 2 to 4, and was set to 10 mm in Comparative Example 3. In all of Experimental Examples 2 to 4 and Comparative Example 3, the wafer 200 illustrated in FIG. 11 was processed.

Processing Conditions of Experimental Examples 2 to 4

Pressure inside chamber 1: 0.3 Torr (40.0 Pa)
Radio-frequency power (VHF 220 MHz): 1,000 W (CW)
Process temperature (stage temperature): 200 degrees C.
Processing gas:
(Experimental example 2) Silicon-containing gas: trisilylamine (TSA)
Nitrogen-containing gas: $N_2$/Ar mixed gas
(Experimental example 3) Silicon-containing gas: $SiH_4$
Nitrogen-containing gas: $N_2$/Ar mixed gas
(Experimental example 4) Silicon-containing gas: tetramethylsilane
Nitrogen-containing gas: $N_2$/Ar mixed gas Processing Conditions of Comparative Example 3

Pressure inside chamber 1: 2 Torr (267 Pa)
Radio-frequency power (RF 13.56 MHz): 2,000 W (CW)
Process temperature (stage temperature): 200 degrees C.
Processing gas: silicon-containing gas: $SiH_4$
Nitrogen-containing gas: $NH_3$/Ar mixed gas As illustrated in FIG. 12, in Experimental Examples 2 and 3, a silicon nitride film (SiN) was formed on the SOC film 202 of the wafer 200. As for the shrinkage of the SOC, in Experimental Example 2, the film thickness was shrunk by 4.4% from 90 nm to 86 nm, and in Experimental Example 3, the film thickness was shrunk by 6.6% from 90 nm to 84 nm. In Experimental Example 4, a SiCN film was formed on the SOC film 202 of the wafer 200. As for the shrinkage of the SOC, the film thickness was shrunk by 7.7% from 90 nm to 83 nm. In Experimental Examples 2 to 4, it was possible to form a silicon nitride film or a SiCN film on the SOC film 202 while reducing damage to the SOC film 202. In Comparative Example 3, a silicon nitride film (SiN) was formed on the SOC film 202 of the wafer 200. As for the shrinkage of the SOC, the film thickness was shrunk by 44% from 90 nm to 50 nm, and the SOC film 202 was damaged. As described above, in the second embodiment, as in the first embodiment, it is possible to form a silicon nitride film (SiN film) or SiCN film at a low temperature of 350 degrees C. or lower without using $NH_3$ and $H_2$, and it is possible to form a silicon nitride film or a SiCN film by CVD on a carbon film (SOC film), which is weak in resistance to H radicals and high-temperature resistance.

The applicable ranges of processing conditions in Experimental Examples 2 to 4 and Comparative Example 3 are illustrated below.

Applicable Ranges of Processing Conditions in Experimental Examples 2 to 4

Pressure inside chamber 1: 0.01 Torr to 50 Torr
Radio-frequency power (VHF 100 MHz to 1 GHz): 10 W to 10 kW
Process temperature (stage temperature): −50 degrees C. to 700 degrees C.
Processing gas:
Silicon-containing gas: dichlorosilane (DCS), silane $SiH_4$, tetramethylsilane (Si(CH$_3$)$_4$): 10 sccm to 5,000 sccm
Nitrogen-containing gas: $N_2$ gas: 100 sccm to 50,000 sccm
Inert gas: He/Ar mixed gas: 0 to 50,000 sccm Applicable Ranges of Processing Conditions in Comparative Example 3

Pressure inside chamber 1: 1 Torr to 20 Torr
Radio-frequency power (RF 400 kHz to 40 MHz): 10 W to 10 kW
Process temperature (stage temperature): 200 degrees C. to 600 degrees C.
Processing gas:
Silicon-containing gas: dichlorosilane (DCS), silane $SiH_4$, tetramethylsilane (Si(CH$_3$)$_4$): 10 sccm to 5,000 sccm
Nitrogen-containing gas: $N_2$ gas: 100 sccm to 50,000 sccm
Inert gas: He/Ar mixed gas: 0 sccm to 50,000 sccm Next, in the second embodiment, as Experimental Examples 5 and 6, 180 MHz and 220 MHz in the VHF band were used as the radio-frequency power, and the film density and refractive index (RI) were evaluated. In addition, as Comparative Examples 4 and 5, 60 MHz and 100 MHz in the VHF band were used as the radio-frequency power, and the film density and refractive index (RI) were valuated. The processing conditions for Experimental Examples 5 and 6 and Comparative Examples 4 and 5 are as follows.

Processing Conditions of Experimental Examples 5 and 6

Pressure inside chamber 1: 0.3 Torr (40.0 Pa)
Processing gas: silicon-containing gas: silane ($SiH_4$)
Nitrogen-containing gas: $N_2$ gas
(Experimental Example 5) Radio-frequency power (VHF 220 MHz): 2,500 W (CW)
(Experimental Example 6) Radio-frequency power (VHF 180 MHz): 2,500 W (CW)

Processing Conditions of Comparative Examples 4 and 5

Pressure inside chamber 1: 0.3 Torr (40.0 Pa)
Processing gas: silicon-containing gas: silane ($SiH_4$)
Nitrogen-containing gas: $N_2$ gas
(Comparative Example 4) Radio-frequency power (VHF 100 MHz): 1,000 W (CW)
(Comparative Example 5) Radio-frequency power (VHF 60 MHz): 1,000 W (CW)

FIG. 13 is a diagram illustrating an example of experimental results in the second embodiment. As illustrated in FIG. 13, in Experimental Example 5 (220 MHz), the film density was 2.89 g/cm$^3$, and the refractive index (RI) was 2.01. In Experimental Example 6 (180 MHz), the film density was 2.81 g/cm$^3$, and the refractive index (RI) was 1.95. In Comparative Example 4 (100 MHz), the film density was 2.57 g/cm$^3$, and the refractive index (RI) was 2.09. In Comparative Example 5 (60 MHz), the film density was 2.49 g/cm$^3$, and the refractive index (RI) was 2.13. As shown in Experimental Examples 5 and 6, by using the frequency of 180 MHz or higher as the radio-frequency power, it is possible to form a silicon nitride film having a high-film density exceeding 2.8 g/cm$^3$ by CVD.

The applicable ranges of processing conditions in Experimental Examples 5 and 6 and Comparative Examples 4 and 5 are illustrated below.

Applicable Ranges of Processing Conditions in Experimental Examples 5 and 6

Pressure inside chamber 1: 0.01 Torr to 50 Torr
Radio-frequency power (VHF 180 MHz to 1 GHz): 10 W to 10 kW
Process temperature (stage temperature): −50 degrees C. to 700 degrees C.
Processing gas:
    Silicon-containing gas: dichlorosilane (DCS), silane SiH$_4$, tetramethylsilane (Si(CH$_3$)$_4$): 10 sccm to 5,000 sccm
    Nitrogen-containing gas: N$_2$ gas: 100 sccm to 50,000 sccm
    Inert gas: He/Ar mixed gas: 0 sccm to 50,000 sccm Applicable Ranges of Processing Conditions in Comparative Examples 4 and 5

Pressure inside chamber 1: 0.01 Torr to 50 Torr
Radio-frequency power (VHF 13.56 MHz to 100 MHz): 10 W to 10 kW
Process temperature (stage temperature): −50 degrees C. to 700 degrees C.
Processing gas:
    Silicon-containing gas: dichlorosilane (DCS), silane SiH$_4$, tetramethylsilane (Si(CH$_3$)$_4$): 10 sccm to 5,000 sccm
    Nitrogen-containing gas: N$_2$ gas: 100 sccm to 50,000 sccm
    Inert gas: He/Ar mixed gas: 0 sccm to 50,000 sccm Although the silicon nitride film or the SiCN film is formed in each of the above-described embodiments, the present disclosure is not limited thereto. For example, a gas containing one or more of Si, Al, Ti, Ta, B, W, and V may be used as a raw material gas. In this case, it is possible to form a silicon nitride film, an aluminum nitride film, a titanium nitride film, a tantalum nitride film, a boron nitride film, a tungsten nitride film, or a vanadium nitride film, or a composite film thereof on a carbon-containing film (carbon film) of the wafer W or the wafer 200.

As described above, according to each embodiment, the film forming apparatus 100 for forming a film on a substrate by plasma includes a processing container (chamber 1) and a controller 7. The processing container includes a stage (susceptor 2) configured to hold a substrate thereon. The controller 7 executes (a) a step of supplying a raw material gas and a reaction gas as processing gases to the processing container, and (b) a step of generating plasma of the processing gases using a radio-frequency power of 100 MHz or higher. As a result, it is possible to suppress damage caused by plasma and to reduce the influence of H radicals on film quality.

According to the first embodiment, as (a), the controller 7 adsorbs a raw material gas onto the substrate (wafer W) having a first film (SOC film 111). In addition, as (b), the controller 7 generates plasma of the reaction gas to react with the raw material gas adsorbed on the substrate having the first film. Furthermore, the controller 7 repeats (a) and (b) to perform the step of forming a second film (silicon nitride film) on the substrate having the first film by atomic layer deposition. As a result, it is possible to form a nitride film on the carbon-containing film (the SOC film 111) by ALD.

According to the first embodiment, the raw material gas is a silicon-containing gas. As a result, it is possible to form a silicon nitride film on the carbon-containing film (SOC film 111) by ALD.

According to a modification of the first embodiment, the silicon-containing gas contains halosilane. As a result, it is possible to form a silicon nitride film as in the two-precursor case.

According to the first embodiment, as (a), the controller 7 executes, (d) a step of adsorbing a first silicon-containing gas containing a halogen-containing silane onto the substrate having the first film and (e) a step of adsorbing a second silicon-containing gas containing a halogen-free silane onto the substrate having the first film. As a result, Si—N bonds may be formed by chemical adsorption, and a more ideal silicon nitride film may be formed.

Further, according to the first embodiment, as (a), the controller 7 alternately performs (d) and (e). As a result, Si—N bonds may be formed by chemical adsorption, and a more ideal silicon nitride film may be formed.

According to the second embodiment, as (a), the controller 7 supplies a mixed gas of the raw material gas and the reaction gas. In addition, as (b), the controller 7 generates plasma of the mixed gas, and forms a second film (silicon nitride film or SiCN film) on the substrate (the wafer 200) having a first film (the SOC film 202) by the generated plasma. As a result, it is possible to form a nitride film on a carbon-containing film (the SOC film 202) by CVD.

According to the second embodiment, the raw material gas is a silicon-containing gas. As a result, it is possible to form a silicon nitride film or a SiCN film on a carbon-containing film (SOC film 202) by CVD.

According to each embodiment, the first film is a carbon-containing film. As a result, it is possible to form a nitride film on a carbon-containing film.

According to each embodiment, the second film is a silicon nitride film. As a result, it is possible to form a silicon nitride film on a carbon-containing film.

According to each embodiment, the raw material gas is a gas including one or more of Si, Al, Ti, Ta, B, W, and V. As a result, it is possible to form a silicon nitride film, an aluminum nitride film, a titanium nitride film, a tantalum nitride film, a boron nitride film, a tungsten nitride film, or a vanadium nitride film, or a composite film thereof on a carbon-containing film.

According to each embodiment, the reaction gas is a gas that does not contain NH$_3$ and amine. As a result, it is possible to suppress damage caused by plasma and to reduce the influence of H radicals on film quality.

According to each embodiment, the frequency of the radio-frequency power is 100 MHz or more and 1 GHz or lower. As a result, it is possible to perform nitriding with N$_2$ gas.

According to each embodiment, the frequency of the radio-frequency power is 180 MHz or more and 1 GHz or lower. As a result, it is possible to form a nitride film having a high film density.

According to each embodiment, the temperature of the substrate is in the range of −50 degrees C. to 700 degrees C. As a result, it is possible to suppress damage to a carbon-containing film.

It shall be understood that each embodiment disclosed herein is exemplary in all respects and not restrictive. Each of the above-described embodiments may be omitted, replaced, or modified in various forms without departing from the scope and spirit of the appended claims.

In each of the above-described embodiments, the stage interval between the susceptor 2 and the shower plate 32 was set to 60 mm in the experimental examples, but the present disclosure is not limited thereto. For example, the interval may be set between 20 mm and 100 mm. In the first embodiment, the interval may be set between 0.2 mm and 200 mm in the raw material gas supply step, and the interval may be set between 3 mm and 200 mm in the plasma irradiation step.

In each of the above-described embodiments, the shower head 3 has a single gas diffusion space 33, but the present disclosure is not limited thereto. For example, the uniformity control of film formation may be performed by dividing the gas diffusion space 33 into a central portion and an outer peripheral portion and controlling the gas flow rate of each portion.

In addition, in the above-described first embodiment, the first silicon-containing gas is a gas containing a halogen-based raw material, and the second silicon-containing gas is a gas containing a non-halogen-based raw material, but the present disclosure is not limited thereto. For example, the first silicon-containing gas may be a gas containing a non-halogen-based raw material, and the second silicon-containing gas may be a gas containing a halogen-based raw material.

In addition, in each of the above-described embodiments, as an example of application, the case where a nitride film is formed on an SOC film has been described, but the present disclosure is not limited thereto. For example, the present disclosure is applicable to patterning using SOC, a metal cap using Ru and W, a barrier for preventing Cu diffusion, self-alignment, or the like.

EXPLANATION OF REFERENCE NUMERALS

1: chamber, 2: susceptor, 3: shower head, 4: exhauster, 5: processing gas supply mechanism, 6: plasma generating mechanism, 7: controller, 81: power feed line, 82: matcher, 83: radio-frequency power supply, 100: film forming apparatus, 110, 201: base substrate, 111, 202: SOC film, 200, W: wafer

What is claimed is:

1. A film forming method that forms a film on a substrate by plasma in a processing container including a stage configured to hold the substrate thereon, the film forming method comprising:
    (a) supplying a raw material gas to the processing container;
    (b) purging the processing container with a nitrogen gas ($N_2$ gas) and an inert gas; and (c) generating plasma of the nitrogen gas by supplying a radio-frequency power of 180 MHz or higher and equal to or lower than 220 MHz to the processing container in which the nitrogen gas and the inert gas are supplied.

2. The film forming method of claim 1, wherein the substrate includes a first film,
    wherein, in the step of (a), the raw material gas is adsorbed onto the substrate having the first film,
    wherein, in the step of (c), the plasma of the nitrogen gas is generated and reacted with the raw material gas adsorbed onto the substrate having the first film, and
    wherein the film forming method further comprises:
    (d) forming a second film on the substrate having the first film by atomic layer deposition by repeating the step of (a) and the step of (c).

3. The film forming method of claim 2, wherein the raw material gas is a silicon-containing gas.

4. The film forming method of claim 3, wherein the silicon-containing gas contains halosilane.

5. The film forming method of claim 4, wherein the first film is a carbon-containing film.

6. The film forming method of claim 5, wherein the second film is a silicon nitride film.

7. The film forming method of claim 6, wherein the substrate has a temperature in a range of −50 degrees C. to 700 degrees C.

8. The film forming method of claim 3, wherein the step of (a) includes:
    (e) adsorbing a first silicon-containing gas including a halogen-containing silane onto the substrate having the first film; and
    (f) adsorbing a second silicon-containing gas including a halogen-free silane onto the substrate having the first film.

9. The film forming method of claim 8, wherein, in the step of (a), the step of (e) and the step of (f) are alternately performed, and
    wherein the step of (b) and the step of (c) are further performed between the step of (e) and the step of (f).

10. The film forming method of claim 1, wherein the raw material gas includes one or more of Si, Al, Ti, Ta, B, W, and V.

11. The film forming method of claim 1, wherein the substrate has a temperature in a range of −50 degrees C. to 700 degrees C.

12. A film forming method that forms a film on a substrate by plasma in a processing container including a stage configured to hold the substrate thereon, the film forming method comprising:
    (a) supplying a mixed gas of a raw material gas, a nitrogen gas ($N_2$ gas), and an inert gas to the processing container; and
    (b) generating plasma of the nitrogen gas by supplying a radio-frequency power of 180 MHz or higher and equal to or lower than 220 MHz to the processing container in which the nitrogen gas and the inert gas are supplied,
    wherein the substrate includes a first film, and
    wherein, in the step of (b), a second film is formed on the substrate having the first film by the generated plasma.

13. The film forming method of claim 12, wherein the raw material gas is a silicon-containing gas.

* * * * *